United States Patent [19]

Gauci et al.

[11] Patent Number: 5,478,420
[45] Date of Patent: Dec. 26, 1995

[54] PROCESS FOR FORMING OPEN-CENTERED MULTILAYER CERAMIC SUBSTRATES

[75] Inventors: John P. Gauci, Putnam Valley; Thomas A. Kline, Wappingers Falls, both of N.Y.

[73] Assignee: International Business Machines Corporation, Armonk, N.Y.

[21] Appl. No.: 281,715

[22] Filed: Jul. 28, 1994

[51] Int. Cl.$^6$ .......................... B32B 31/04; B32B 31/20; B32B 31/26
[52] U.S. Cl. .............. 156/89; 156/247; 156/323; 264/58; 264/61
[58] Field of Search .............. 156/89, 247, 323; 264/58, 61

[56] References Cited

U.S. PATENT DOCUMENTS

| | | | |
|---|---|---|---|
| 4,341,727 | 7/1982 | Landsness et al. | 264/145 |
| 4,567,545 | 1/1986 | Mettler, Jr. | 361/401 |
| 4,636,275 | 1/1987 | Norell | 156/289 |
| 4,680,075 | 7/1987 | McNeal ret al. | 156/289 |
| 4,710,250 | 12/1987 | Kojima et al. | 156/89 |
| 4,737,208 | 4/1988 | Bloechle et al. | 156/323 X |
| 4,833,000 | 5/1989 | Trickett et al. | 428/137 |
| 4,890,153 | 12/1989 | Wu | 357/74 |
| 4,896,464 | 1/1990 | Kim et al. | 51/319 |
| 5,027,191 | 6/1991 | Bourdelaise et al. | 357/74 |
| 5,032,106 | 7/1991 | Warburton | 425/292 |
| 5,041,396 | 8/1991 | Valero | 437/209 |
| 5,085,720 | 2/1992 | Mikesaka et al. | 156/89 |
| 5,091,770 | 2/1992 | Yamaguchi | 357/74 |
| 5,114,651 | 5/1992 | Warburton | 264/156 |
| 5,116,440 | 5/1992 | Takeguchi et al. | 156/289 X |
| 5,124,522 | 6/1992 | Booke et al. | 219/121.19 |
| 5,130,067 | 7/1992 | Flaitz et al. | 264/60 |
| 5,155,067 | 10/1992 | Wood et al. | 437/209 |
| 5,160,747 | 11/1992 | Kizaiki et al. | 425/352 |
| 5,176,771 | 1/1993 | Bravo et al. | 156/85 |
| 5,188,985 | 2/1993 | Medeiros, III et al. | 437/218 |
| 5,435,875 | 7/1995 | Saitoh et al. | 156/89 X |

FOREIGN PATENT DOCUMENTS

| | | |
|---|---|---|
| 61-239943 | 10/1986 | Japan . |
| 61-291996 | 12/1986 | Japan . |
| 63-310774 | 12/1988 | Japan . |

*Primary Examiner*—David A. Simmons
*Assistant Examiner*—M. Curtis Mayes
*Attorney, Agent, or Firm*—Whitham, Curtis, Whitham & McGinn; Harold Huberfeld

[57] ABSTRACT

A multilayer ceramic substrate with an internal cavity extending from the top to the bottom surface of the substrate is produced using an insert material which fits within a cavity defined by aligned openings of individual ceramic sheets in a multilayer stack. The multilayer stack of ceramic sheets, together with the insert, is press-molded together with the insert serving as an internal mold that maintains the internal dimensions of the cavity. The insert is slightly larger in its top to bottom dimension than the multilayer stack and is driven into a compressible material underlying the multilayer stack during the pressing operation. The insert prevents the ceramic from flowing upwards into the center of the cavity during the pressing operation. In addition, the insert embeds electrically conductive pads located at various levels inside the cavity on individual ceramic sheets in the multilayer stack into the top surfaces of the ceramic sheets. After molding, the insert and the compressible material are removed from the multilayer structure. The invention has a particular application for forming multilayer ceramic structures that are connected to an integrated circuit chip and heat sink combination that will be positioned inside the cavity of the ceramic structure.

7 Claims, 3 Drawing Sheets

PROCESS FOR FORMING OPEN-CENTERED MULTILAYER CERAMIC SUBSTRATES

BACKGROUND OF THE INVENTION

1. Field of the Invention

The invention is generally related to methods for manufacturing multilayer ceramic substrates and, more particularly, to a method for forming multilayer ceramic substrates with cavities extending through the substrate from the top to bottom where the internal dimensions of the cavity are precisely controlled.

2. Description of the Prior Art

Multilayer ceramic structures are often formed by a "sub-lamination" process wherein the first two ceramic sheets are stacked on top of each other and laminated at low temperature and pressure, and then the next two ceramic sheets are stacked on the top and bottom of the first two ceramic sheets with the four sheets then being laminated together at low temperature and pressure, and so on, until the total number of layers in the multilayer ceramic structure is reached. One problem with the "sub-lamination" process is that it requires multiple lamination steps, which slow product throughput. Another problem with the "sub-lamination" process is that it does not provide uniform lamination from the first layer to the last. This is primarily due to the first set of layers being exposed to pressure and temperature more than the last set. This in turn causes non-uniform shrinkage of the ceramic layers during the sintering cycle, and results in excessive camber of the part, and may also result in cracking of the ceramic material.

The "sublamination" process is not ideal for forming open-centered multilayer ceramic substrates wherein a chip/heat sink combination will be connected to the substrate in a cavity formed through the substrate. The process results in non-uniform shrinkage of the layers, and this causes excessive camber at each of the individual layers as well as adversely effects the overall flatness of the part. In addition, when the layers are warped, it is difficult to make electrical connections to the wire bond pad areas. When the part itself is not flat, it is difficult to make an adequate connection between the heat sink and the multilayer ceramic substrate.

SUMMARY OF THE INVENTION

It is therefore an object of this invention to provide a method of manufacturing open-centered multilayer ceramic substrates wherein the internal dimensions of a cavity through the substrate and the overall flatness of the substrate are precisely controlled.

According to the invention, a plurality of ceramic layers, also commonly referred to as "green sheets" or "green tapes," are stacked together on top of a stacking frame. The stacking frame preferably has one or more layers of thick green sheets thereon with a top layer of a material that does not adhere to green sheets. Suitable non-adhering materials include polyesters such as Mylar® available from Du Pont. Each of the ceramic layers to be laminated together includes at least one opening therethrough and the openings are aligned to create a cavity through the stack from the top to the bottom. At least one, and possibly several of the openings, are of different cross-sectional size dimensions such that when the ceramic layers are stacked, the cavity has a plurality of internal ledges resulting from individual ceramic layers in the stack. Electronic pads connected to circuitry on the ceramic layers are positioned on the ledges inside the cavity in the stack adjacent to the openings in the ceramic layers.

An insert having a side wall perimeter contour matched to the internal dimensions of the cavity defined by the openings in the individual layers in the stack is placed within the cavity. The insert is preferably made from a metal, such as steel; however, the chief requirement is that the insert be a hard material which retains its shape during the pressing operation. The insert is sized slightly larger in its top to bottom dimension than the top to bottom dimension of the stacked ceramic substrates. In addition, the insert has steps which correspond directly with the plurality of ledges inside the cavity. The suface of each of the steps which contacts the electronic pads on the ledges is flat.

The multilayer stack is laminated together with the insert in place by compression molding between a pair of plates of a press. During compression molding, the ceramic material of each of the layers flows towards the center and around the perimeter of the insert which acts as the mold of the multilayer ceramic substrate cavity. The flat surface of the steps causes the electronic pads on the ledges of the ceramic layers to become embedded in the ceramic layer as the ceramic material flows around the pads and towards the center. Hence, the flat surface of the insert produces flat ledges with embedded electronic pads. In addition, during compression molding of the stacked ceramic substrates, the insert is driven into the compressible material underneath the ceramic stack. The use of a compressible material and overdriving the insert prevents the ceramic material from flowing upwards into the center of the stack.

After lamination of the stack, the insert is removed from the cavity and the compressible material is stripped from the base of the stack. The stack is then sintered and plated, if required. Subsequently, a heat sink is attached to the stack by a suitable method, such as by brazing. An integrated circuit chip may then be attached to the heat sink and connected to the substrate. Because the electronic pads on the ledges are flat, wiring from the chip to the pads proceeds in a reliable fashion. Because all the layers are laminated simultaneously, excessive camber is reduced and the heat sink can more reliably be connected to the flat bottom of the multilayer ceramic structure.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1A:
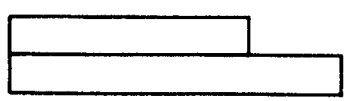
FIG. 1a is a cross-sectional side view of two ceramic green sheet layers, each with a centrally located opening, between which a binder (not shown) is sprayed.
Figure 1A:
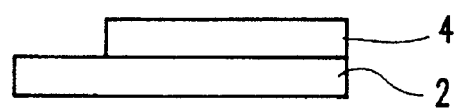
Figure 1B:
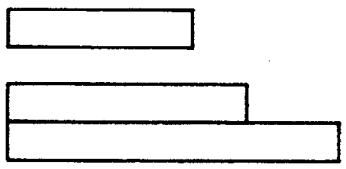
FIG. 1b is a cross-sectional side view of previously laminated two bottom ceramic green sheet layers as shown in FIG. 1a and one top ceramic green sheet layer to be laminated with a centrally located opening, between which a binder (not shown) is sprayed.
Figure 1B:
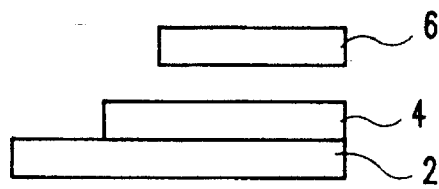
Figure 1C:
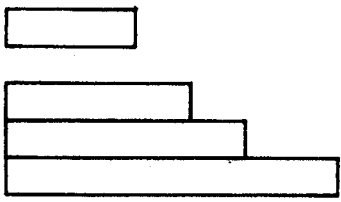
FIG. 1c is a cross-sectional side view of previously laminated three bottom ceramic green sheet layers as shown in FIG. 1b and one top ceramic green sheet layer to be laminated with a centrally located opening, between which a binder (not shown) is sprayed.
Figure 1C:
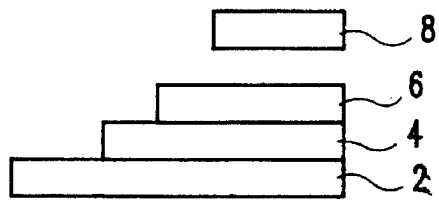

Referring now to the drawings, and more particularly to FIGS. 1a through 1d, there are shown the sequential steps of a prior art method of forming open-centered multilayer ceramic substrates by sub-lamination process steps. In FIG. 1a, the first two sheets 2 and 4 that comprise the multilayer ceramic substrate are stacked one on top of another. A binder, such as Butvar®, a polyvinyl butyral resin available from Monsanto, is sprayed between the two sheets, and then the sheets 2 and 4 are laminated at a very low temperature and pressure. In the sub-lamination process, each layer is laminated individually. FIG. 1b shows that the next layer 6 of the multilayer ceramic substrate is laminated to the first two layers 2 and 4 using a binder and low temperature and pressure lamination. FIG. 1c shows that the next layer 8 of the multilayer ceramic substrate is laminated to the first three layers 2, 4 and 6 using a binder and low temperature and pressure lamination.

Figure 1D:
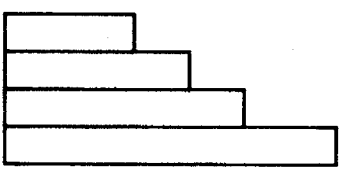
FIG. 1d is a cross-sectional side view of laminated four ceramic green sheet layers, each with a centrally located opening.
Figure 1D:
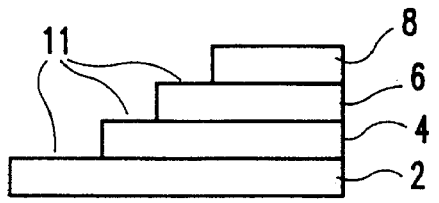

FIG. 1d shows the open centered multilayer substrate which results from the prior art sub-lamination process. A significant disadvantage of the sub-lamination process is that it requires several processing steps; thus, reducing the manufacturing throughput which is possible. Another significant disadvantage of the sub-lamination process is that the first set of layers 2 and 4 are exposed to pressure and temperature more than the last layer 8. Thus, uniform lamination pressure from the first layer 2 to the last layer 8 cannot be expected. This, in turn, causes non-uniform shrinkage of the ceramic tape during the sinter cycle, which results in excessive camber of the part. The excessive camber extends both to the wire bond pad areas which must be flat in order to ensure proper wire bond pad, and to the overall flatness of the multilayer substrate itself, which must be flat to allow for proper attachment of a heat slug.

Figure 2:
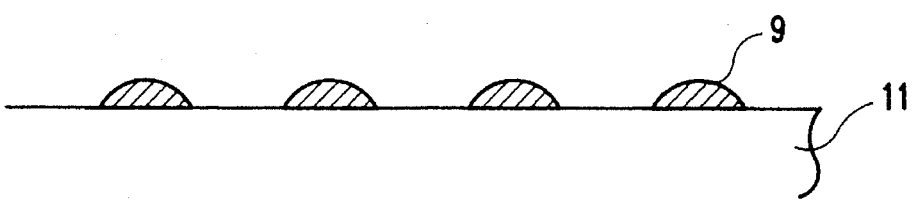
FIG. 2 is a cross-sectioinal view of the wire bond ledge formed in the prior art process illustrated in FIGS. 1a–d.

FIG. 2 illustrates yet another disadvantage of the prior art sub-lamination process. Specifically, because there is no means to provide pressure against the bonding pad regions 9 centrally located on the ledges 11 created in the multilayer stack by the individual layers 2, 4, and 6, the pads 9 remain in the same condition as they were after screening. That is, the pads 9 are rounded and non-planar with the ledge 11 surface. This round profile makes wire bonding difficult.

Figure 3:
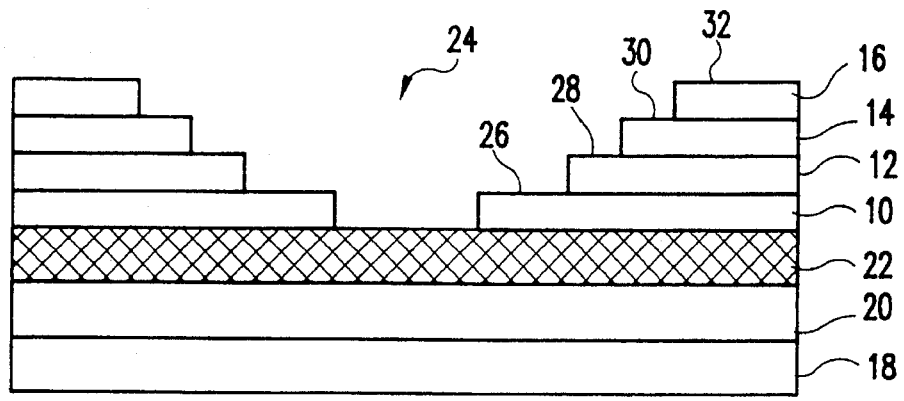
FIG. 3 is a cross-sectional side view of multiple ceramic green sheet layers, each with a centrally located opening, stacked with the openings in each of the green sheets in alignment on top of a support comprised of green sheets overlayed with a compressible material that does not adhere to green sheets.

With reference to FIG. 3, a plurality of ceramic layers 10, 12, 14, and 16, which are often referred to as "green sheets" or "green tapes" are stacked on top of a stacking frame (not shown) which preferably has one or two green sheet layers 18 and 20 and a layer of a compressible material 22 that does not adhere to ceramic green sheets. The preferred compressible material 22 is a polyester such as Mylar® available from Du Pont. Each of the ceramic layers 10, 12, 14, and 16 has an opening that extends therethrough, and the openings are oriented in alignment in the stack to create a cavity 24 that extends through the stacked ceramic layers to the underlying compressible material 22. The openings in the layers 10, 12, 14, and 16 are shown in FIG. 3 to have varying width dimensions such that ledges 26, 28, 30, and 32 are formed in the cavity 24 when the layers are stacked. It is not necessary that all layers have different opening dimensions; however, this invention is particularly directed to structures which will have at least one ledge inside the cavity 24.

Each of the layers 10, 12, 14, and 16 can have similar or different electrical functions such as carrying signal, power, ground, or other circuitry to be connected to an integrated circuit chip (not shown). The layers 10, 12, 14, and 16 may or may not be electrically connected using through vias (not shown) between adjacent layers. The thickness of each of the ceramic layers is a matter of design choice and would typically range between 3 and 25 mils; however, the thickness may vary considerably outside the 3–25 mil range. Suitable green sheet material for each of the layers is commercially available from a wide variety of sources including alumia slurry from Du Pont, IBM, and Coors. The openings in the green sheets 10, 12, 14, and 16, can be formed by a wide variety of techniques such as cutting, photo-lithography, etching, etc. The size of the openings will be a matter of design choice and will depend on the types of electrical components to be connected to the multilayer ceramic substrate. For example, the openings may range from 0.125 to 1 inch in cross-section; however, the range can vary considerably outside the 0.125–1 inch range.

Figure 4:
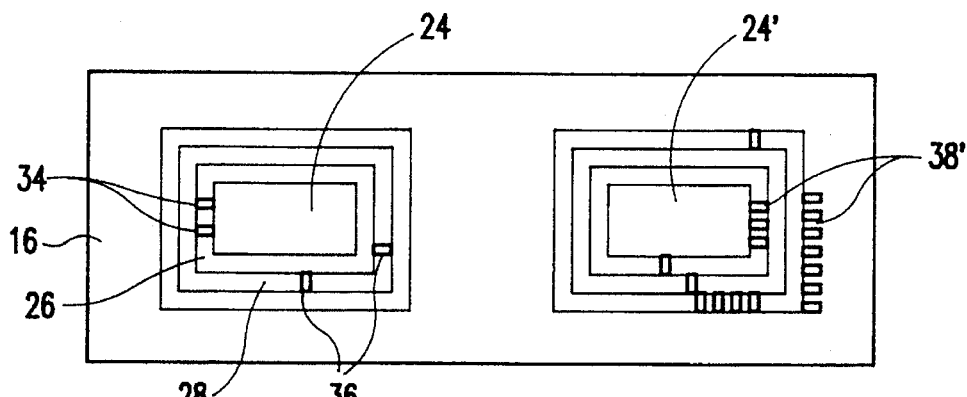
FIG. 4 is a top view of multiple ceramic green sheets in a stack with two cavities created in the stack from openings in each of the ceramic layers in the stack showing electronic circuit connection pads on some of the ledges in the cavities.

FIG. 4 shows that the multilayer ceramic may have two or more cavities 24 and 24' depending on the needs of the user. FIG. 4 shows electrical connection pads 34 on ledge 26 and electrical connection pads 36 on ledge 28 of the cavity 24. However, it should be understood that a large number of connection pads can be used, and that connection pads 38' can be present on every ledge as is shown in cavity 24'. The electrical connection pads are connected to circuitry (not shown) on the ceramic layers 10, 12, 14, and 16, and are typically made from molybdenum, tungsten, copper, silver, gold, and varius alloy materials. The electrical connection pads are created using thick film or other suitable processing techniques.

Figure 5:
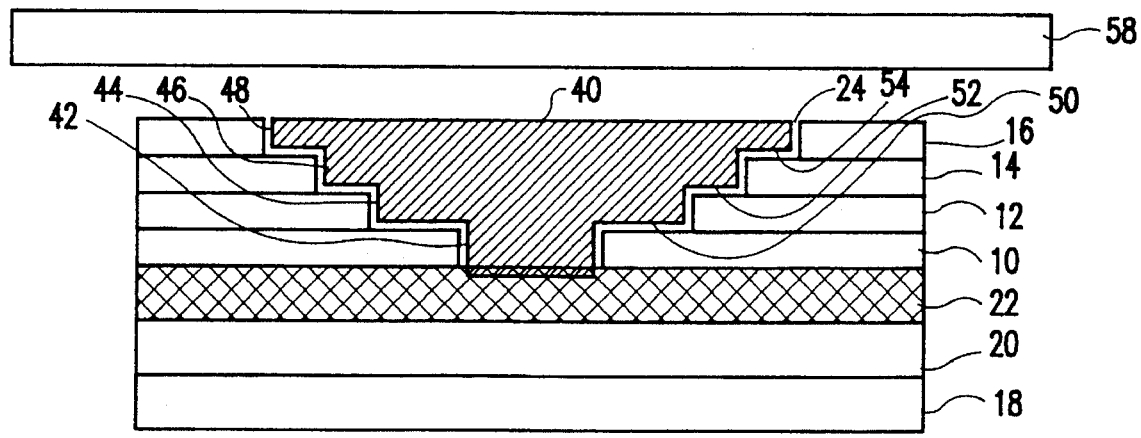
FIG. 5 is a cross-sectional side view of a multilayer green sheet stack together with an insert positioned in the cavity of the stack where the stack and insert are located between a pair of compression plates.

FIG. 5 shows an insert 40 positioned in the cavity 24 of the multilayer ceramic stack described in conjunction with FIG. 3. The insert 40 is preferably made of a metal such as steel; however, the chief requirement is that the insert 40 be of a hard material that does not change its shape during lamination of the ceramic layers 10, 12, 14, and 16, and is removable from the ceramic layers after lamination. The insert 40 is preferably positioned in the cavity 24 by an automated process such as electromechanical or electromagnetic placement. Ideally, a plurality of inserts could be simultaneously placed in a plurality of cavities in a single operation.

The insert 40 should have a contoured side wall which matches the side walls of the cavity 24. As is shown in FIG. 5, the insert 40 has a side wall with surface 42 that corresponds to the inner periphery of the opening in layer 10, a surface 44 that corresponds to the inner periphery of the opening in layer 12, a surface 46 that corresponds to the inner periphery of the opening in layer 14, and a surface 48 that corresponds to the inner periphery of the opening in layer 16. The cross-sectional area occupied by the insert 40 should be slightly smaller than the cross-sectional area of the openings in the layers 10, 12, 14, and 16, so that the ceramic material in each of the layers may flow towards the insert 40 and around the periphery of the insert 40 during lamination. In this way, the insert 40 serves as an internal mold for the cavity 24 such that very precise dimensions for the ledges 26, 28, 30, and 32, defined by the contoured side wall, are maintained during lamination. The distance between the insert 40 and the side of a ceramic layer will vary depending on the thickness of the layer, and the temperature and pressure conditions used during lamination. Typically, where the layers are 3–20 mils thick, the distance should be on the order of 1–10 mils.

The ceramic layer stack, together with the insert 40 in the cavity 24 is compressed under temperature and pressure conditions between plates 56 and 58 that are suitable to cause flow of the ceramic material. Typically, for green sheet material, the temperature will range between 60° and 90° C. and the pressure will range between 1,000 and 5,000 psi; however, the temperature and pressure conditions can vary widely depending on the needs of the fabricator and the materials utilized in the multilayer ceramic substrate. The ceramic material in adjacent layers will flow together and cause them to be laminated. The ceramic material will also flow towards the insert 40 and around its periphery; thus, the dimensions of the cavity will be precisely controlled using the insert 40 as an internal mold. Since all layers are simultaneously and uniformly laminated together, the layers will not be prone to warping.

Figure 6:
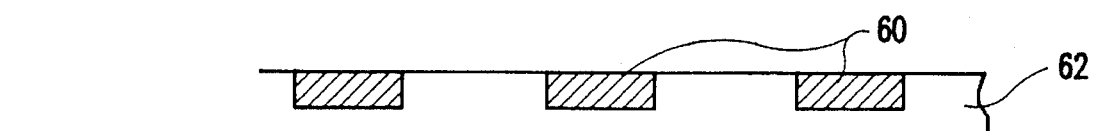
FIG. 6 is a cross-sectional side view of a ledge of a multilayer ceramic substrate of the present invention showing a plurality of electronic circuitry connection pads embedded in the ledge.

Steps 50, 52, and 54 on the insert 40 have a flat surface that corresponds to ledges 26, 28, and 30. During compression molding, the ledges of the 26, 28, and 30 will conform to the flat surface by having the ceramic material flow around the electrical connection pads. As is shown in FIG. 6, the electrical connection pads 60 will become embedded in the ceramic material 62 during molding. Therefore, the ledges 26, 28, and 30 inside the cavity 24 of the multilayer substrate produced will have a flat surface with flat electrical connection pads due to the steps 50, 52, and 54 in the insert 40. Having flat electrical connection pads significantly simplifies forming electrical connections between a chip to be positioned within cavity 24 and the circuitry on the individual layers in the multilayer ceramic substrate produced.

FIG. 5 shows that insert 40 has a slightly larger top to bottom dimension than the dimension from the top to the bottom of the stack of ceramic layers 10, 12, 14, and 16. This is shown in FIG. 5 by the top line of insert 40 aligned even with the top line of the stack of ceramic layers 10, 12, 14, and 16, but with the bottom line of insert 40 protruding into the top portion of the compressible material 22 at the centrally located opening site of the bottom green sheet layer 10. In operation, the insert 40 is positioned in the cavity 24 on top of the compressible material 22. Pressure plates 56 and 58 then drive the insert 40 into the compressible material 22 while the ceramic layers 10, 12, 14 and 16 are laminated together. The excess top to bottom dimension of the insert 40 is a matter of choice to the ceramic substrate fabricator and is dependent on the number of ceramic layers being laminated and the thickness of the individual layers. For example, for a four-layer substrate with each layer being approximately 15 mils thick, the top to bottom dimension of the insert should be on the order of 62 to 75 mils. In general, the insert 40 should have a top to bottom dimension that is 1 to 5 percent larger than the top to bottom dimension of the multilayer stack.

Providing an insert 40 with a larger top to bottom dimension than the multilayer stack serves several functions. First, due to pressure from the plates 56 and 58 forcing the insert 40 down against the compressible material 22, the steps 50, 52, and 54 are able to embed the electrical connection pads into the respective ledges of the ceramic layers, as is discussed in conjunction with FIG. 6. Second, because the insert 40 overdrives through the cavity 24 and compresses the compressible material 22 during compression molding, the dimensions and integrity of the cavity 24 through the multilayer ceramic substrate is maintained and the ceramic material in the individual layers 10, 12, 14, and 16 is prevented from flowing upwards into the center of the cavity 24. Third, because the compressible material 22 compresses under the force of the insert 40, the top and bottom surfaces of the multilayer structure are maintained uniformly flat. This is because the compression pressure on opposite sides of the cavity 24 is equal.

After compression molding, the insert 40 and compressible material 22 are removed to leave a multilayer ceramic substrate that has a flat top and bottom surface and flat ledges in the cavity 24 with embedded electrical connection pads. During removal of the insert 40, the extraction must be by a means which pulls the insert 40 straight up. This will prevent camber of the ledges and delamination between layers. As with placing the insert, the insert is preferably removed by a magnetic or electromagnetic, and, preferably several inserts in several different open-centered multilayer ceramic substrates can be simultaneously removed. The multilayered ceramic substrate is then sintered to produce an integral, fired, ceramic. The wire bond pads on the ledges in the ceramic, as well as the heat sink connection sites are preferably plated using standard techniques. A heat sink and an integrated circuit chip are then attached to the ceramic at the cavity site.

Figure 7:
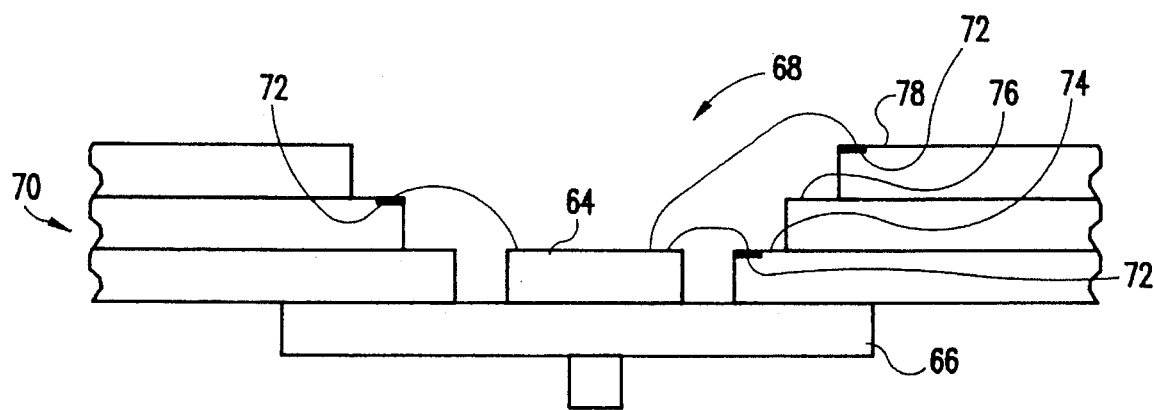
FIG. 7 is a cross-sectional side view of a chip and heat sink assembly connected to an open-centered multilayer ceramic substrate fabricated according to the present invention.

FIG. 7 shows an integrated circuit chip 64 attached to heat sink 66 positioned in cavity 68 of a multilayer ceramic substrate 70 created according to the techniques of the present invention. Because the insert used has flat step surfaces, the electrical connection pads 72 are embedded into the ledges 74, 76, and 78, and the top surface of the ledge is uniformly flat. This simplifies the process of connecting wires 80 between the electrical connection pads 72 and chip 64. In addition, because the pressure applied by the plates 56 and 58 is uniform across the top and bottom of the stack, the multilayer ceramic substrate 70 is flat. This allows an easier, more precise, connection between the heat sink 66 and the bottom 80 of the multilayer ceramic substrate 70 to be made.

While the invention has been described in terms of its preferred embodiments, those skilled in the art will recognize that the invention can be practiced with modification within the spirit and scope of the appended claims.

Having thus described our invention, what we claim as new and desire to secure by Letters Patent is as follows:

1. A process for making open-centered multilayer substrates, comprising the steps of:
   forming on top of a compressible layer a multilayer stack of ceramic sheets wherein each of said ceramic sheets has an opening therethrough and said opening in each of said ceramic sheets is in alignment, and wherein at least one of said ceramic sheets has an opening of a larger dimension than other ceramic sheets in said multilayer stack, whereby a ledge is created in said aligned openings in said multilayer stack;

placing an insert inside said aligned openings in said multilayer stack, said insert having a top to bottom dimension which is larger than a top to bottom dimension of said multilayer stack, said insert having an outer periphery matched to said aligned openings;

laminating said multilayer stack together with said insert positioned in said aligned openings, said laminating step forcing said insert into said compressible layer; and removing said insert and said compressible layer from said multilayer stack.

2. The process recited in said claim 1 wherein said removing step includes the step of using a magnet or electromagnet to remove said insert.

3. The process recited in claim 2 wherein said ledge produced during said forming step includes electrically conductive pads thereon, and wherein said laminating step embeds said electrically conductive pads into said ledge.

4. A process for making multilayer substrates, comprising the steps of:

stacking a plurality of ceramic sheets to create a multilayer stack, each of said ceramic sheets having at least one opening which extends through said ceramic sheet from a top to a bottom of said ceramic sheet, said step of stacking being performed so that said opening through each of said ceramic sheets is in alignment, whereby a cavity in said multilayer stack is formed from a top to a bottom of said multilayer stack from said openings through said ceramic sheets, at least two ceramic sheets in said multilayer stack having openings of different sizes, wherein a first opening through a first ceramic sheet is larger in cross-sectional area than a second opening through a second ceramic sheet, said cavity in said multilayer stack having an internal ledge at said second ceramic sheet having said second opening, said first and second ceramic sheets each having on a top surface at least one electrically conductive pad adjacent said first and second openings, respectively, said stacking step being performed on top of a compressible material which does not adhere to said ceramic sheets;

positioning an insert in said cavity of said multilayer stack, said insert having a top to bottom dimension larger than said top to said bottom of said multilayer stack, said insert having a contoured side wall having a perimeter dimension from said top to said bottom of said insert that is matched to a cross-sectional area dimension of each of said openings in said ceramic sheets in said multilayer stack from said top to said bottom of said multilayer stack, said insert having at least a first step in said contoured side wall which extends over said electrically conductive pad on said first ceramic sheet adjacent said first opening and a second step in said contoured sidewall which extends over said second electrically conductive pad on said second ceramic sheet adjacent said second opening at said internal ledge in said cavity when said insert is positioned in said cavity during said positioning step, said first and second steps having a flat surface which contacts said top surfaces of said first and second ceramic sheets;

pressing said multilayer stack together, after said step of positioning, under temperature and pressure conditions which cause adjacent ceramic sheets in said multilayer stack to be laminated together, said insert serving as a mold during said pressing step which maintains said cross sectional area dimensions of each of said openings in said ceramic sheets, said insert extending into and compressing said compressible material during said pressing step, said first step and said second step of said insert embedding said electrically conductive pads on said first and second ceramic sheets adjacent said first and second openings into said top surfaces of said first and second ceramic sheets, said step of pressing producing a laminated multilayer ceramic stack; and removing said insert and said compressible material from said laminated multilayer ceramic stack.

5. The process recited in claim 4, further comprising the steps of:

sintering said laminated multilayer ceramic stack to produce a ceramic substrate; and plating said electrically conductive pads.

6. The process recited in claim 5, further comprising the steps of:

attaching an integrated circuit chip and a heat sink to said ceramic substrate; and connecting said integrated circuit chip to said electrically conductive pads.

7. The process recited in claim 4 wherein said removing step includes the step of using a magnet or electromagnet to remove said insert.

* * * * *